(12) United States Patent
Ueda et al.

(10) Patent No.: US 6,670,975 B2
(45) Date of Patent: Dec. 30, 2003

(54) LASER CONTROL DEVICE

(75) Inventors: Satoshi Ueda, Ibaraki (JP); Kazutoshi Obara, Ibaraki (JP); Kenichi Ito, Ibaraki (JP)

(73) Assignee: Hitachi Printing Solutions, Ltd., Ebina (JP)

( * ) Notice: Subject to any disclaimer, the term of this patent is extended or adjusted under 35 U.S.C. 154(b) by 0 days.

(21) Appl. No.: 10/190,558

(22) Filed: Jul. 9, 2002

(65) Prior Publication Data

US 2003/0038872 A1 Feb. 27, 2003

(30) Foreign Application Priority Data

Aug. 24, 2001 (JP) ........................ P.2001-254176

(51) Int. Cl.[7] ........................ B41J 2/385; G03G 13/04
(52) U.S. Cl. ........................ 347/132
(58) Field of Search ................ 347/132, 133, 347/135, 236, 246, 253, 247

(56) References Cited

U.S. PATENT DOCUMENTS

| | | | | |
|---|---|---|---|---|
| 4,763,241 A | * | 8/1988 | Egawa et al. | 347/132 |
| 4,937,591 A | * | 6/1990 | Miyake et al. | 347/236 |
| 4,967,284 A | * | 10/1990 | Yoshida et al. | 347/133 |
| 5,550,573 A | * | 8/1996 | Serizawa et al. | 347/246 |
| 6,476,955 B1 | * | 11/2002 | Yoshida | |

* cited by examiner

*Primary Examiner*—Susan S. Y. Lee
(74) *Attorney, Agent, or Firm*—McGinn & Gibb, PLLC

(57) ABSTRACT

A laser control device includes a light amount varying section for varying the light exposure amount at plural levels is provided with a correction section for correcting the difference between the times to the peaks of laser outputs of print signals input to a laser control circuit. The turning on time of each print signal is corrected, whereby the difference between the times to the peaks of laser outputs of the print signals different in light exposure amount can be eliminated for correcting the difference between image print positions.

6 Claims, 6 Drawing Sheets

WEAK LIGHT EXPOSURE PART
STRONG LIGHT EXPOSURE PART

GAUSSIAN DISTRIBUTION
$I = I_0/e^{-(2r^2/r_0^2)}$

WEAK LIGHT EXPOSURE PART
STRONG LIGHT EXPOSURE PART

LASER CONTROL DEVICE

BACKGROUND OF THE INVENTION

1. Field of the Invention

This invention relates to a laser control device used with an electrophotographic apparatus such as a copier or a laser beam printer.

2. Description of the Related Art

The relationship between the light intensity of a laser and the surface potential of a photoconductor and the image density will be discussed with reference to FIGS. 3 to 6. Usually, a light exposure optical section applies a laser to the photoconductor surface uniformly charged by a charger, whereby the charges of the laser-applied portion are removed for attenuating the surface potential and an electrostatic latent image is formed. A developing section electrostatically deposits toner of charged fine particles on the electrostatic latent image.

The laser output from the light exposure optical section normally forms a Gaussian distribution as shown in FIG. 3 and has the largest light intensity at the center and lessened moderately as away from the center.

FIG. 4 shows the relationship between the surface potential of the photoconductor and the laser light intensity (light exposure amount); the larger the light exposure amount, the more attenuated the surface potential of the photoconductor. Thus, the laser output is a Gaussian distribution and therefore the surface potential of the photoconductor exposed to light by the laser becomes the lowest at the center and becomes higher as away from the center, as shown in FIG. 5. Since toner of charged fine particles is easily deposited on a place where the potential difference is the largest, namely, a place where the surface potential of the photoconductor is low, the image density is the highest at the center and is lower as away from the center, as shown in FIG. 6. From FIGS. 3 to 6, if the light exposure amount of the laser is small, the attenuated surface potential is also small and thus the toner deposition amount also lessens and the image density is low and the dot diameter also lessens. If the light exposure amount of the laser is large, the image density is high and the dot diameter also increases.

From the relationship between the laser light exposure amount and the surface potential of the photoconductor, hitherto, to hold uniform image quality, a laser of a constant light exposure amount has been applied for uniformly attenuating the surface potential of the photoconductor to form an electrostatic latent image, and toner has been electrostatically deposited on the electrostatic latent image to provide the uniform density. On the other hand, however, if high-density print is executed, there has been tendency to crush small letters and thin lines. If the print condition is changed for printing so as to prevent characters from being crushed, a problem of lowering the density of a solid black part has occurred and it has been difficult to provide image quality compatibility between small characters and solid black.

In recent years, with development of different high resolutions, from the fact that the attenuation amount of the surface potential of the photoconductor varies depending on the applied light exposure amount, a system wherein light amount varying means for varying the light exposure amount of a laser at a plurality of levels is provided for varying the light exposure amount of the applied laser in response to an image for adjusting the attenuation amount of the surface potential of the photoconductor has been known. In this system, small dots are formed in a thin line part in a low light exposure amount and large dots are formed in a solid black part in a large light exposure amount for adjusting the deposited toner amount. The dot diameter is thus varied in the light exposure amount responsive to the print image for depositing the optimum toner amount for controlling the print density, whereby compatibility between clear print of small characters and thin lines and high-density print of a solid black part is provided for executing high-resolution print.

FIG. 7A is a schematic drawing to show a laser control device in a related art having light amount varying means for varying the light exposure amount of a laser at a plurality of levels. In FIGS. 7A and 7B, a print signal for weak light exposure and a print signal for strong light exposure are converted into drive signals of a laser 3 by a laser control circuit 2 for controlling the light exposure amount of the laser for each print signal, thereby driving the laser 3. A and C in FIG. 7B indicate dots printed by laser outputs α and γ. FIG. 8 is an image drawing of a print image when an image "A" is printed as an example using two types of light amounts of weak light exposure and strong light exposure according to the laser control configuration shown in FIGS. 7A and 7B; FIG. 8B is a whole drawing and FIG. 8A is an enlarged view of a part.

Since the light exposure amounts at a plurality of levels are used for control to provide the compatibility between clear print and high-density print, the time to reaching a preset light amount (peak) in one light exposure amount differs from that in another light exposure amount and the light exposure amounts differ and thus dot diameters of various sizes are formed. If the longitudinal write positions of the print signal for weak light exposure a and the print signal for strong light exposure c and the signal ON times (light exposure times of laser) are the same as shown in FIGS. 7A and 7B in the laser control device using the light exposure amounts at a plurality of levels, the time to the peak of the laser output α of strong light exposure differs from the time to the peak of the laser output γ of weak light exposure by one time t, and the printed dots differ by distance d corresponding to the time t. Thus, the laser control device in the related art produces the relative difference between the peak positions of the light exposure amounts. Thus, for the image comprising weak and strong light exposure parts mixed as shown in FIGS. 8A and 8B, the weak and strong light exposure parts differ in print position by one distance d in the scanning direction. Because of such a phenomenon, the definition (resolution) of the print image is impaired in such a manner that a longitudinal white stripe is entered in a perpendicular direction to the scanning direction in solid black, etc., which is a problem.

SUMMARY OF THE INVENTION

The present invention has been made in view of the above, and therefore an object of the invention is to correct the turning on time of a print signal, thereby matching the times to the peaks of laser outputs with each other for removing the difference between print positions to accomplish high-resolution print.

To achieve the above object, according to the invention, a laser control device comprising light amount varying means for varying the light exposure amount at a plurality of levels is provided with correction means for correcting the turning on time of a print signal. Particularly, means for delaying the turning on time of the print signal in response to the light exposure amount is provided. According to the configuration, the peak positions of laser outputs of the print signals relative to the light exposure amounts at a plurality of levels can be matched with each other, so that the difference between image print positions can be removed to accomplish high-resolution print.

DETAILED DESCRIPTION OF THE PREFERRED EMBODIMENTS

Now, a description will be given in more detail of preferred embodiments of the invention with reference to the accompanying drawings.

A laser control device comprising light amount varying means for varying the light exposure amount at two levels of weak and strong light exposure amounts will be discussed.

Figure 1A:
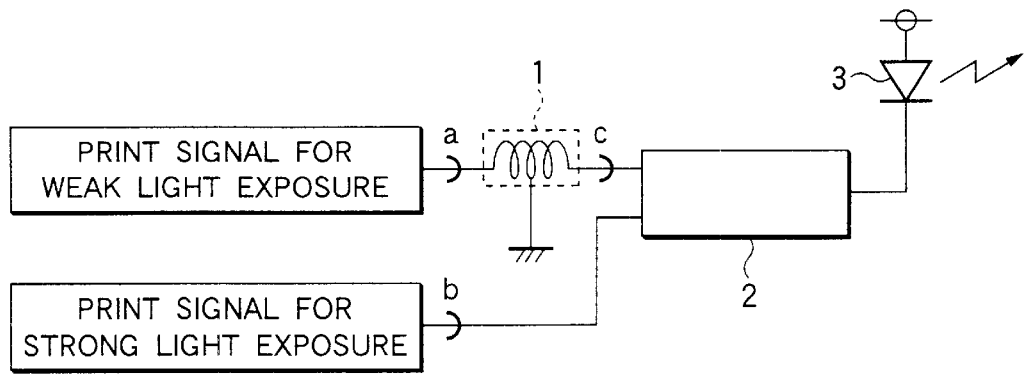
FIGS. 1A and 1B are schematic drawings to show one embodiment of a laser control device of the invention.
Figure 1B:
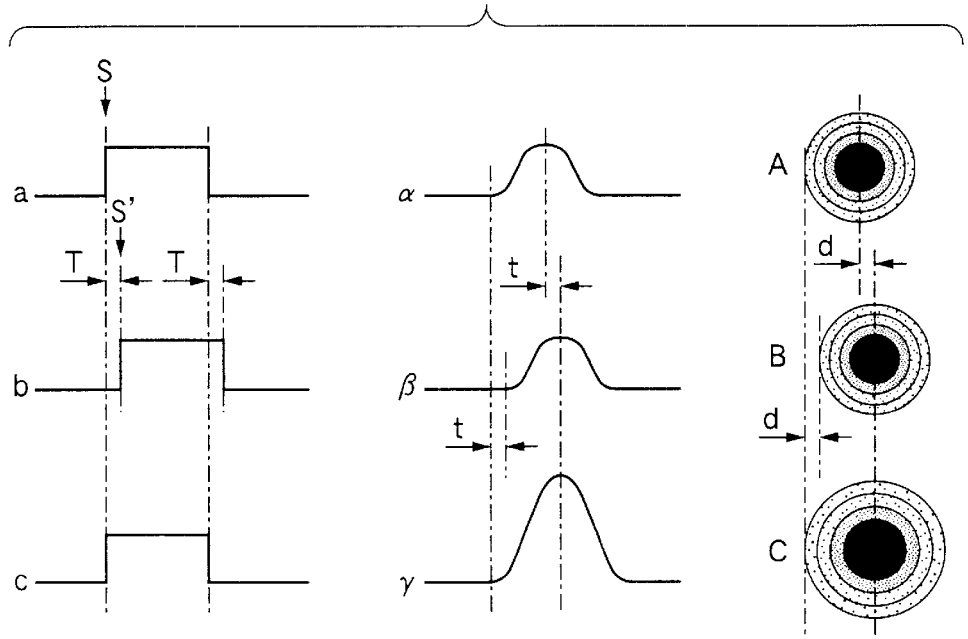

FIGS. 1A and 1B are schematic drawings to show one embodiment of the invention.

In FIG. 1A, a print signal for weak light exposure is input through a delay circuit 1 to a laser control circuit 2. The delay circuit 1 delays the signal turning on time (rising time) S by one time T. Therefore, the turning on time S7 of a signal b is delayed by the time T behind the signal a with the pulse width intact, as shown in FIG. 1B. The dot diameter in B is the same as that in A. On the other hand, a print signal for strong light exposure c is input to the laser control circuit 2 as it is. Next, the print signals a, b, and c are converted into drive signals of a laser 3 by the laser control circuit 2 for controlling the light exposure amount of the laser for each print signal, thereby driving the laser 3. The delay time T corresponds to difference time t between peak positions and the time t corresponds to difference distance d between print positions. α, β, and γ represent laser outputs of the print signals a, b, and c output by the laser 3 respectively.

As a method of classifying the print signals into those for weak light exposure and strong light exposure, for example, a method of preparing several patterns of N×N-dot matrix (N is an integer) and changing the light exposure amount of the target pixel when the light exposure pattern is encountered is used.

Figures 2A, 2B:
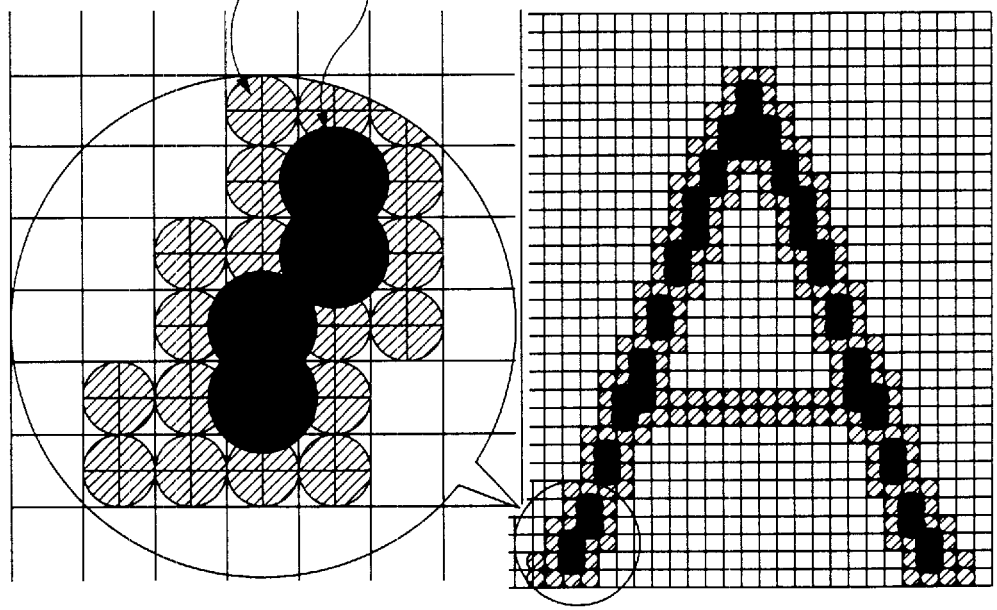
FIGS. 2A and 2B are image drawings of a print image provided by the laser control device of the embodiment of the invention.
Figure 3:
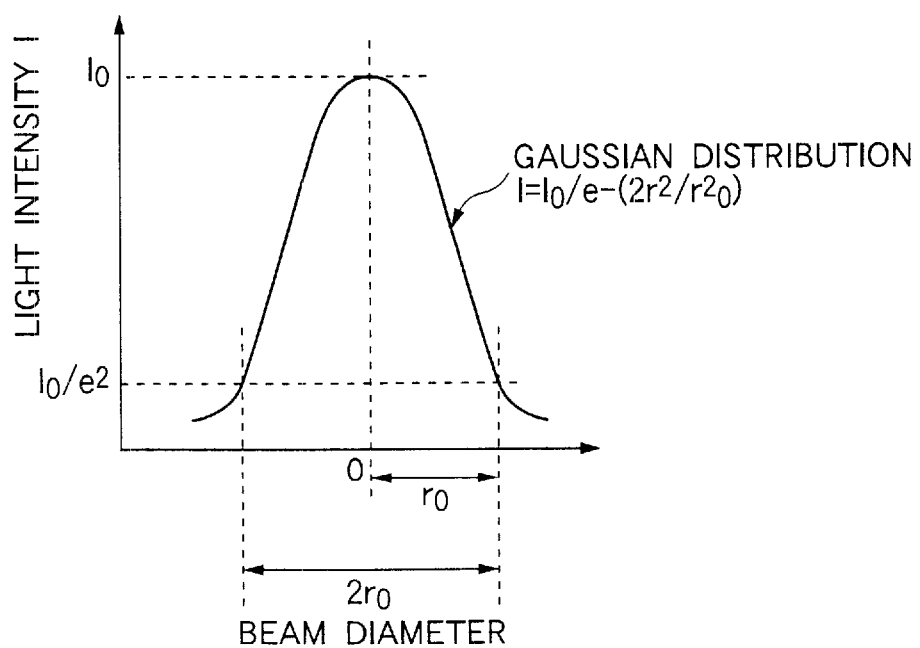
FIG. 3 is a graph showing a light intensity distribution of a laser.
Figure 4:
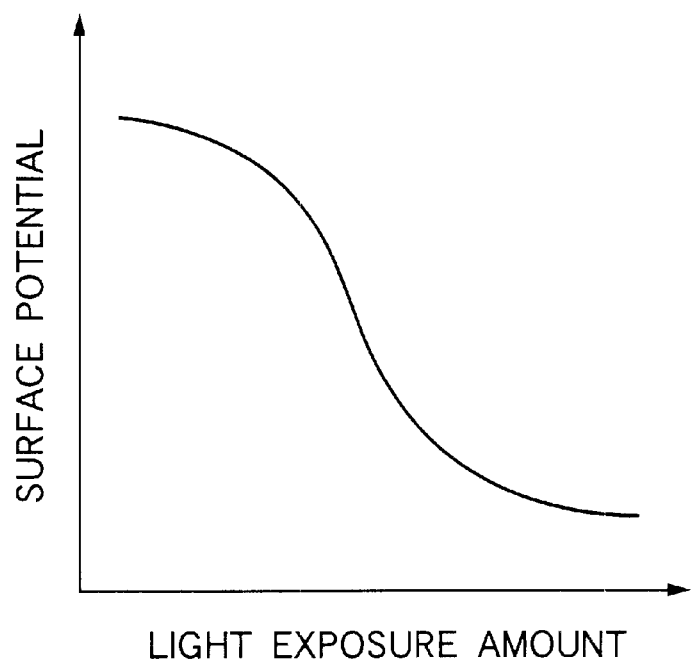
FIG. 4 is a drawing to show the relationship between the surface potential of a photoconductor and the light exposure amount.
Figure 5:
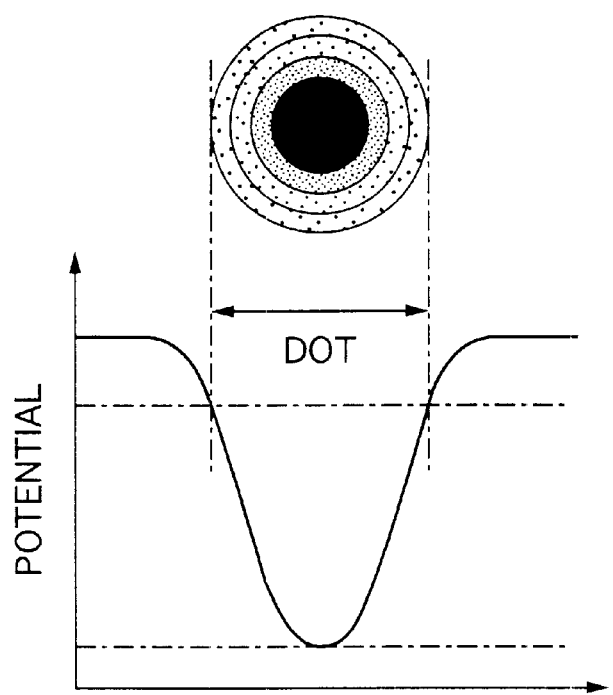
FIG. 5 is a drawing to show the surface potential formed on the photoconductor.
Figure 6:
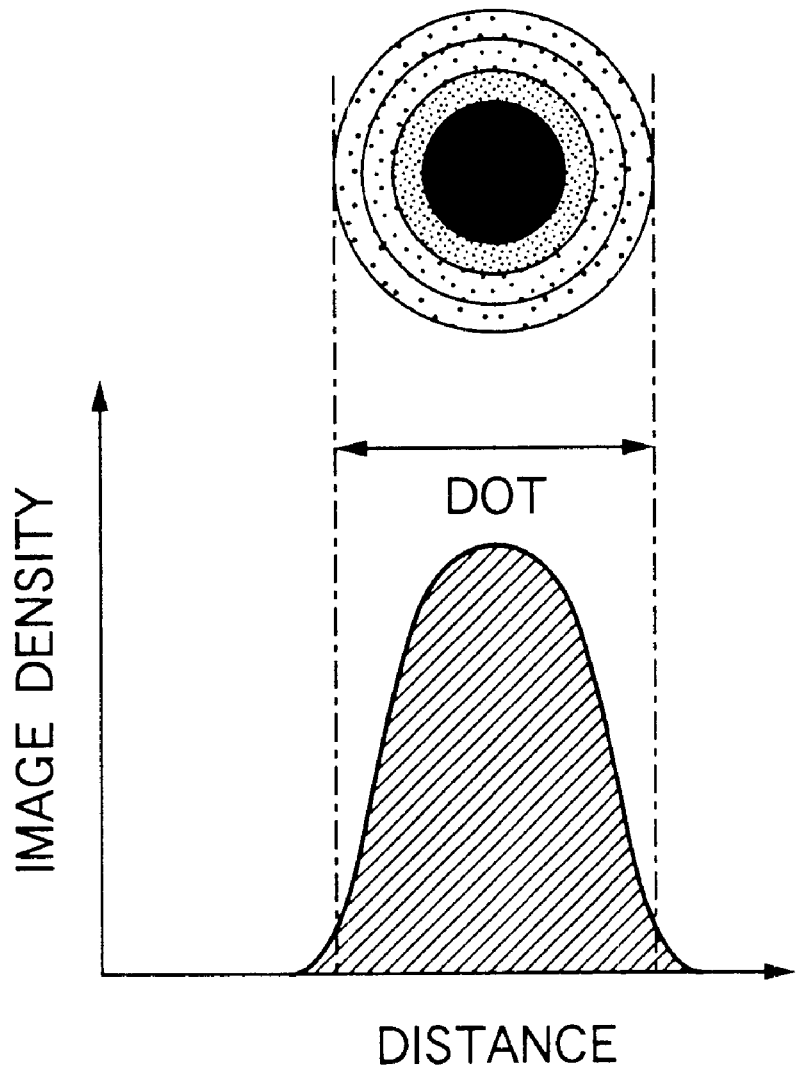
FIG. 6 is a drawing to show the image densities in a light exposure part and a light non-exposure part on the photoconductor.
Figure 7A:
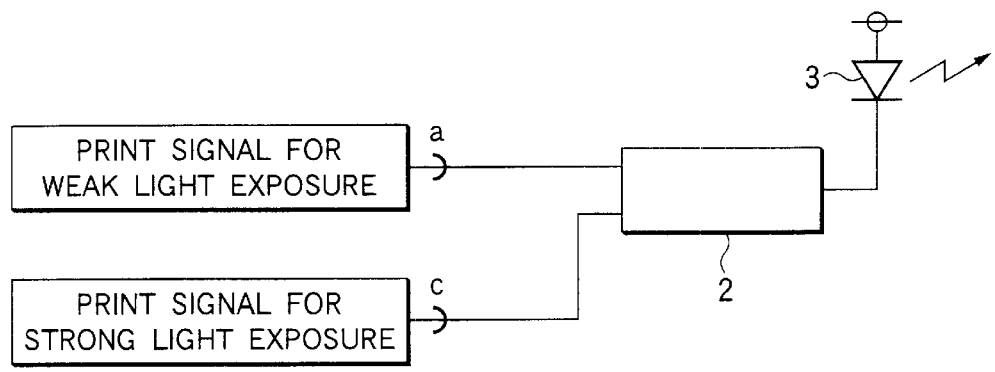
FIGS. 7A and 7B are schematic drawings of a laser control device in a related art.
Figure 7B:
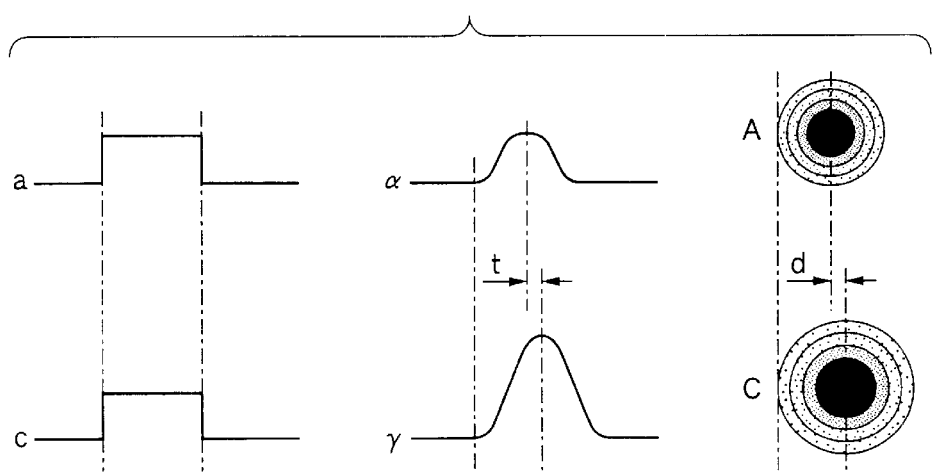
Figure 8A:
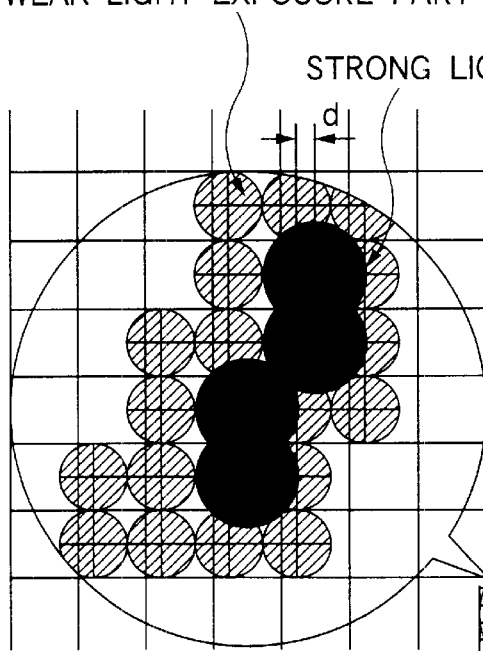
FIGS. 8A and 8B are image drawings of a print image in the related art.
Figure 8B:
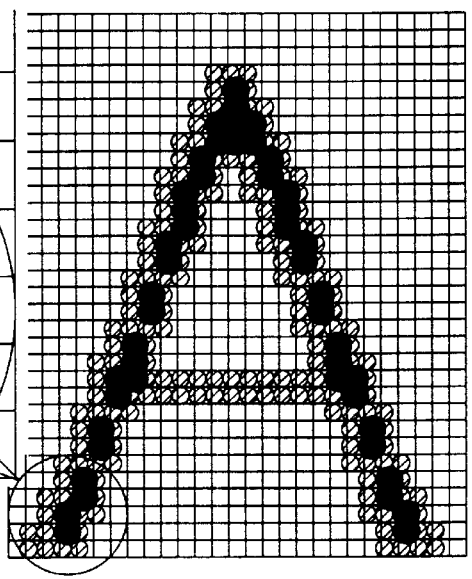

Next, as actual print, print of an image "A" as an example using two types of light amounts of weak light exposure and strong light exposure will be discussed. FIGS. 2A and 2B are image drawings of a print image with the delay circuit 1 according to the invention in FIG. 1; FIG. 2B is a whole drawing and FIG. 2A is an enlarged view of a part.

For example, a delay circuit using a delay line or a time constant of a resistor and a capacitor is used to delay the turning on time of a print signal for weak light exposure by time T corresponding to difference time t between peak positions. As an example of the invention, in FIG. 1, the delay circuit 1 of a delay line having a delay of time T is used to delay the turning on time of a print signal for weak light exposure by the time T corresponding to the difference time t between peak positions. Accordingly, the laser output α of the print signal for weak light exposure becomes laser output β with the peak position delayed by the time t. Thus, the difference between the laser output peak positions of the print signals for weak light exposure and strong light exposure can be canceled and the laser output peak positions can be matched with each other. Therefore, the print position difference between the weak and storing light exposure parts can be canceled. Thus, high-resolution print can be accomplished. The delay circuit is used as means for correcting the turning on time, whereby high-resolution print with no print position difference can be accomplished according to the simple circuit configuration.

According to the invention, the light exposure optical section having the light amount varying means for varying the light exposure amount of the laser at a plurality of levels corrects the turning on time of a print signal in response to the light exposure amount at a plurality of levels, whereby the difference between the times to the peaks of laser outputs of the print signals different in light exposure amount can be eliminated for removing the difference between image print positions, so that high-resolution print can be accomplished.

What is claimed is:

1. A laser control device for an electrophotographic apparatus using a semiconductor laser as a light source for exposing a surface of a photoconductor to light upon reception of a print signal sent from a host, said laser control device comprising:

light amount varying means for varying the light exposure amount of the semiconductor laser applied to the photoconductor at a plurality of levels; and correction means for correcting the turning on time of the print signal in the light amount varying means.

2. The laser control device as claimed in claim 1 wherein the correction means comprises a delay circuit.

3. The laser control device as claimed in claim 2 wherein print signals are classified into at least those for weak light exposure and strong light exposure and the delay circuit is provided for the print signal for weak light exposure.

4. The electrophotographic apparatus comprising a laser control device as claimed in claim 1.

5. The electrophotographic apparatus comprising a laser control device as claimed in claim 2.

6. The electrophotographic apparatus comprising a laser control device as claimed in claim 3.

* * * * *